United States Patent
Taheri et al.

(10) Patent No.: US 7,149,114 B2
(45) Date of Patent: Dec. 12, 2006

(54) LATCH CIRCUIT AND METHOD FOR WRITING AND READING VOLATILE AND NON-VOLATILE DATA TO AND FROM THE LATCH

(75) Inventors: Babak A. Taheri, San Francisco, CA (US); Sanjeev K. Maheshwari, San Jose, CA (US); Fredrick B. Jenne, Los Gatos, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 206 days.

(21) Appl. No.: 10/803,011

(22) Filed: Mar. 17, 2004

(65) Prior Publication Data

US 2005/0207223 A1    Sep. 22, 2005

(51) Int. Cl.
G11C 14/00 (2006.01)
G11C 7/10 (2006.01)
G11C 17/18 (2006.01)
G11C 17/14 (2006.01)

(52) U.S. Cl. .......................... 365/185.08; 365/189.05; 365/225.7; 365/96

(58) Field of Classification Search .......... 365/185.08, 365/189.05, 205, 225.7, 96
See application file for complete search history.

(56) References Cited

U.S. PATENT DOCUMENTS

| | | | | |
|---|---|---|---|---|
| 4,878,203 A | * | 10/1989 | Arakawa | 365/185.08 |
| 5,029,132 A | * | 7/1991 | Arakawa | 365/185.08 |
| 5,097,449 A | * | 3/1992 | Cuevas | 365/185.07 |
| 5,602,776 A | * | 2/1997 | Herdt et al. | 365/185.08 |
| 5,812,477 A | * | 9/1998 | Casper et al. | 365/225.7 |
| 5,999,447 A | * | 12/1999 | Naura et al. | 365/185.04 |
| 6,141,247 A | * | 10/2000 | Roohparvar et al. | 365/185.08 |
| 6,297,103 B1 | * | 10/2001 | Ahn et al. | 438/275 |
| 6,617,914 B1 | * | 9/2003 | Kothandaraman | 327/525 |
| 2003/0210599 A1 | | 11/2003 | McClure | |
| 2004/0008539 A1 | | 1/2004 | Pascucci | |

OTHER PUBLICATIONS

International Search Report, PCT/US2005/008154, mailed Jul. 1, 2005.

* cited by examiner

*Primary Examiner*—J. H. Hur
(74) *Attorney, Agent, or Firm*—Kevin L. Daffer; Daffer McDaniel, LLP

(57) ABSTRACT

A latching circuit is provided that includes a latch, a storage element, and a selection circuit coupled between the latch and the storage element. The latch can receive true and complementary voltage values from, for example, a data bus and, if called upon, forward the latched value to the non-volatile storage element via the selection circuit. Control signals sent to the selection circuit allow the latched data to be written to or read from the storage element. Once programmed, the voltage values will remain in the latching circuit even after power is removed. If the latched data is not sent to the non-volatile storage element, the latching circuit essentially functions as a volatile latch, and the data will be lost if power is removed. The switching circuit thereby operates as a dual-purpose volatile and non-volatile latching circuit that can be embodied as an array of latching circuits that temporarily and/or permanently store true and complementary data signals.

16 Claims, 5 Drawing Sheets

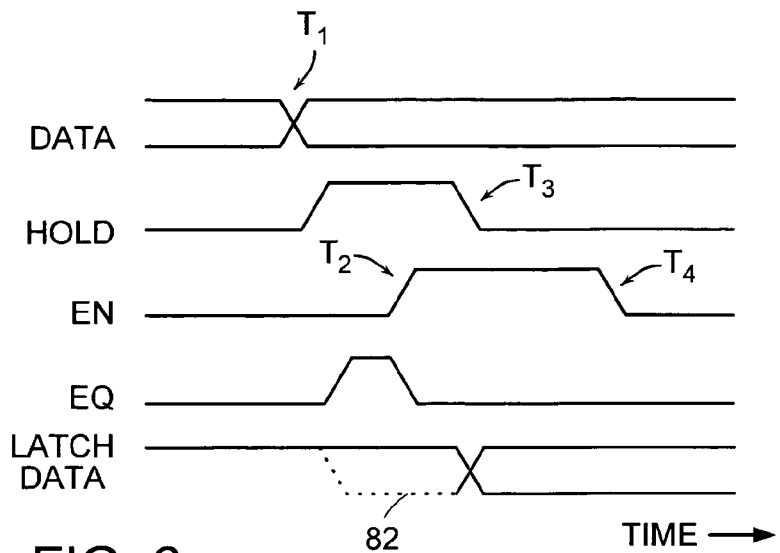
FIG. 6
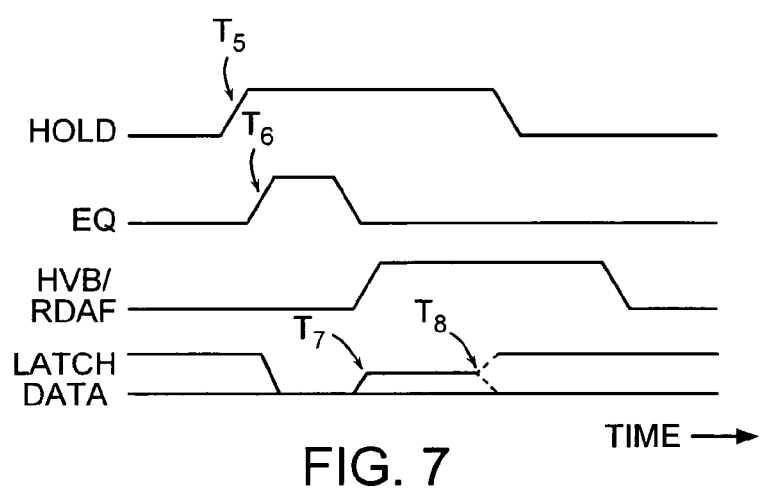
FIG. 7
| | EN | HLD | NV_RD RDAF | PROG | HVB | $V_P$ |
|---|---|---|---|---|---|---|
| IDLE (HOLD) | 0 | 0 | 0 | 0 | 0 | LOW |
| WRITE TO LTCH FROM D_BUS | 1 | 1*0 | 0 | 0 | 0 | LOW |
| PRGM AF FROM LTCH | 0 | 0 | 0 | 1 | 1 | HIGH |
| WRITE TO LTCH FROM AF | 0 | 0 | 1 | 0 | 1 | LOW |
FIG. 8

LATCH CIRCUIT AND METHOD FOR WRITING AND READING VOLATILE AND NON-VOLATILE DATA TO AND FROM THE LATCH

BACKGROUND OF THE INVENTION

1. Field of the Invention

This invention relates to electronic circuitry and, more particularly, to a latch coupled to retain data sent from either a data bus or a programmable storage element, wherein the latch avoids relatively high current paths when the storage element is being accessed during programming. This also helps reduce circuit size and improves overall reliability.

2. Description of the Related Art

The following descriptions and examples are given as background information only.

Most electronic subsystems have data storage capability. For example, bi-stable circuits such as flip-flops can maintain data in one of two binary logic values depending on the last input to the flip-flop. A popular bi-stable circuit that will maintain the logic value until rewritten is generally known as a latch.

A latch can be formed in many ways. For example, a static random access memory (SRAM) cell consists essentially of a pair of cross-coupled inverters that latch a logic value until rewritten with another logic value. The SRAM latch cell can store the true and complementary logic values sent to the latch from, for example, a data bus. The latch logic values can later be read when, for example, an execution unit executes a fetch operation from an addressed storage cell.

Unlike many types of memory cells that require periodic refresh, a latch will retain the stored data without requiring a refresh until such time as power is removed from the latch. There are many applications that require permanent storage of data even though power is unavailable to maintain that storage. For example, read-only memory (ROM) storage cells can be programmed, and the programmed state retained in the absence of power. ROM storage media is often used in software applications that do not readily change or are needed as a boot-up driver. For example, a ROM is typically used as part of the basic input/output system (BIOS) code, and can be used in look-up tables and character generators.

Once programmed, ROMs will often maintain their programmed state depending on the type of ROM used. Generally speaking, however, storage devices that maintain a stored logic value after power is removed are known as non-volatile memory elements. Conversely, storage elements that lose the stored state once power is removed are known as volatile memory elements.

A latch is typically known as a volatile storage element, whereas masked ROMs or field-programmable ROMs (i.e., PROM) are known as non-volatile memory. Other forms of non-volatile memory include EPROM and EEPROM. The primary difference between PROM and EPROM (or EEPROM) is that the former are generally programmable only once, and thereafter cannot be erased. The latter can be erased either through ultraviolet light or electrical erasure. Flash memory also is used for such applications requiring erasure and non-volatile features.

Electronic subsystems often use both volatile and non-volatile memory. The volatile memory is usually placed within an integrated circuit separate and apart from an integrated circuit that embodies the non-volatile memory. There may be instances, however, where both volatile and non-volatile storage elements are on the same integrated circuit. In this instance, however, data targeted for the volatile memory storage elements is generally altogether different from the data targeted for the non-volatile storage elements since the use of that data is altogether different— i.e., has different applications.

It would be desirable to implement a storage device that has both a volatile and non-volatile feature. For example, if data is to be temporarily held when power is present, the storage device utilizes a latch into which the data is written and can thereafter be read. If that data being written into the latch is of sufficient importance that it is to be maintained after power is removed, the storage device would also desirably include a non-volatile storage element into which the latched data can be written and later retrieved even though power is lost in the interim. The desired storage device which functions essentially as a latch, but also has non-volatile storage, represents an improvement over conventional storage devices that are dedicated either as a latch or as non-volatile storage, but not both.

In addition to the desirability of having a dual-purpose storage device over conventional system that do not serve a dual-purpose role, it would be further desirable to separate certain deleterious features that occur when programming (writing) and reading into and from the non-volatile storage element from the normal operation of the latch. For example, it would be desirable to eliminate any current paths within a latch caused whenever the non-volatile storage element is written to, or programmed. It would further be desirable to achieve these goals without increasing the overall size of the dual-purpose storage device. Finally, implementing such storage elements in sub-quarter micron integrated circuit process technologies without additional process steps needed to accommodate higher programming voltages is challenging yet highly desirable.

SUMMARY OF THE INVENTION

The problems outlined above are in large part solved by a dual-purpose storage device. The storage device is a circuit that includes both a latch and a non-volatile storage element. The latch can be made from a pair of cross-coupled inverters and the storage element is made to retain a stored logic value even after power is removed from the circuit.

The latch can be written to by true and complementary logic values present on a data bus. The values stored in the latch can later be read back onto the data bus. During the interim, the latch value will retain binary logic value without having to perform periodic refresh of that value. Whatever logic values are written into the latch can thereafter be written into the non-volatile storage element. Thus, the same binary value can be stored and/or retrieved from both the volatile latch and the non-volatile storage element. The storage element can be programmed to retain the written logic values even after power is removed. The values stored in the non-volatile storage element can later be read onto the latch and/or data bus that is coupled to the latch.

The sequence of events for writing to and reading from the latch and non-volatile storage element are: (i) write data from a data bus to the latch; (ii) write the same data from the latch to the non-volatile storage element; (iii) write-back the data from the non-volatile storage element to the latch; and (iv) read the data stored on the latch back onto the data bus. The second and third steps are performed if data is to be stored and thereafter retrieved from a non-volatile medium. Otherwise, the data need only be placed (written) to the latch and thereafter read without any steps between the first and fourth steps.

The non-volatile storage element can preferably be a one-time programmable storage element, such as a PROM. The storage element can be programmed in the field after the circuit is manufactured and sent to a customer, for example. Once programmed, however, the voltage value stored in the storage element cannot be erased. A popular form of PROM includes anti-fuse storage. If an anti-fuse is used, programming the anti-fuse involves blowing closed a power supply voltage onto the latch. Otherwise, the anti-fuse remains open and no power supply voltage is applied onto the latch.

If the non-volatile storage element involves a one-time programming anti-fuse element, then significant currents are needed to "blow closed" the anti-fuse. It is desirable to keep the programming current from traversing the rather small FET devices in the latch. Instead of increasing the size of the latch FETs, the present circuit utilizes a current path for the programming current that is outside of the latch. This allows for a smaller overall circuit footprint to achieve the dual-purpose volatile latch/non-volatile storage element combination.

According to one embodiment, the present circuit includes a latch and a non-volatile storage element. The non-volatile storage element is coupled to the latch and, during programming of the storage element, the storage element avoids forwarding current from the storage element into the latch.

According to another embodiment, the circuit is a one-time programmable latching circuit. The latching circuit includes a latch having a pair of cross-coupled inverters and a pair of one-time programmable storage elements coupled to respective outputs of the inverters. The storage elements include a pair of storing transistors that have a gate oxide thickness dissimilar from a gate oxide thickness of any of the set of latching transistors. Thus, the one-time programmable latching circuit utilizes different gate oxide thicknesses for the storage elements than other FETs within the latching circuit. Preferably, in order to program the storage elements, the gate oxide thickness for the storage element transistors can be made less than the other FETs.

According to yet another embodiment, a method is contemplated. The method includes the steps of programming the non-volatile storage elements. A voltage value can be latched from a data bus onto a pair of cross-coupled inverters. Next, the latched voltage value can be forwarded onto a gate of a selecting transistor to activate that selecting transistor. Thereafter, programming current from the storage element can be driven through the activated, selecting transistor to a ground supply conductor to program that storage element.

BRIEF DESCRIPTION OF THE DRAWINGS

Other objects and advantages of the invention will become apparent upon reading the following detailed description and upon reference to the accompanying drawings in which:

FIG. 6 is a timing diagram of voltage values occurring when the latch is written to from the data bus;

FIG. 7 is a timing diagram of voltage values occurring when the latch is written to from the programmable storage element;

FIG. 8 is a chart of voltage values placed on certain inputs to the latch, selection circuit and programmable storage element during hold, write to latch from data bus, write to storage element from latch, and write to latch from the storage element;

Figure 1:
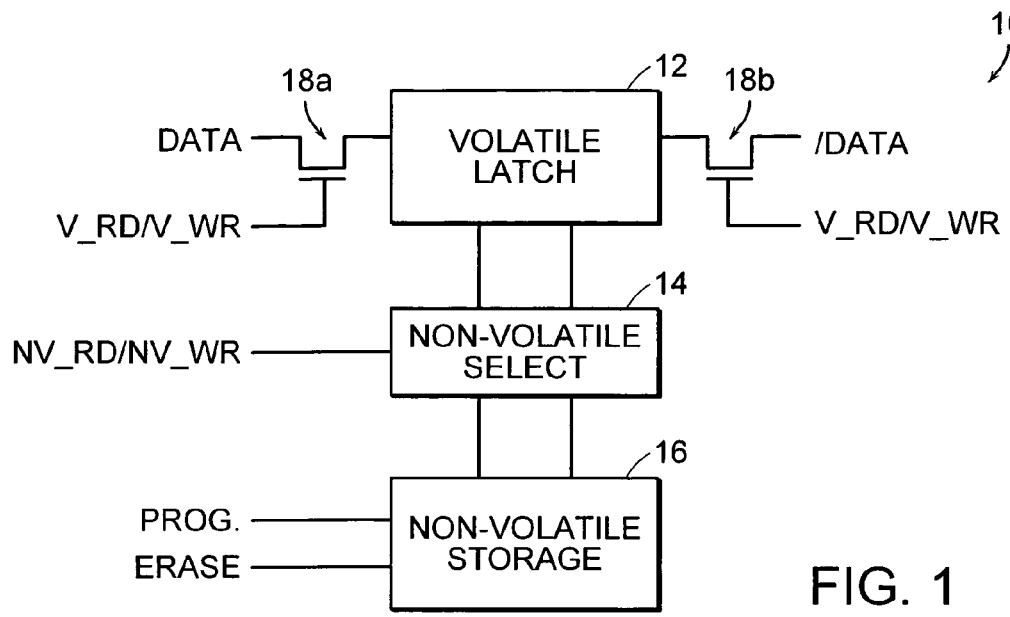
FIG. 1 is a block diagram of a latch, selection circuit and programmable storage element, wherein the latch can write data from a data bus to the storage element or can read programmed data from the storage element onto the data bus.

While the invention may include various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates a dual-purpose latching circuit 10. Circuit 10 includes a volatile latch, or simply "latch," 12, a non-volatile selection circuit 14, and non-volatile storage 16. Data upon a data bus can be forwarded to latch 12 by activating a write (V_WR) signal at the appropriate gate of coupling transistors 18a and 18b. Thus, the true (DATA) and complementary (/DATA) data logic values can be written into or read from latch 12 via coupling transistors 18a and 18b.

Once within latch 12, the true and complementary logic values can be written into the storage elements 16 via selection circuit 14. Activating the non-volatile write signal (NV_WR) will couple the latch logic value onto the appropriate non-volatile storage element whenever the program (PROG.) signal is activated. Once written to, the storage element can be read by activating the non-volatile read signal (NV_RD) to place the non-volatile stored logic value back onto latch 12. Depending on whether the non-volatile storage 16 is one-time programmed or can be re-programmed, an erase signal can be used (ERASE) to re-program the non-volatile storage. A one-time programmable storage device 16 cannot be erased and, therefore, the erase signal will not be used for such an embodiment.

FIG. 1 basically illustrates the mechanics by which data can be written to and read from a latch, but if the data is to be permanently stored to preserve the data should power cease, circuit 10 also indicates the mechanics of writing data to and reading data from the non-volatile storage device. Both the latch and non-volatile storage device are attributable to the same data logic value and, therefore, are connected to temporarily and/or permanently store that same true and complementary logic voltage values.

Figure 2:
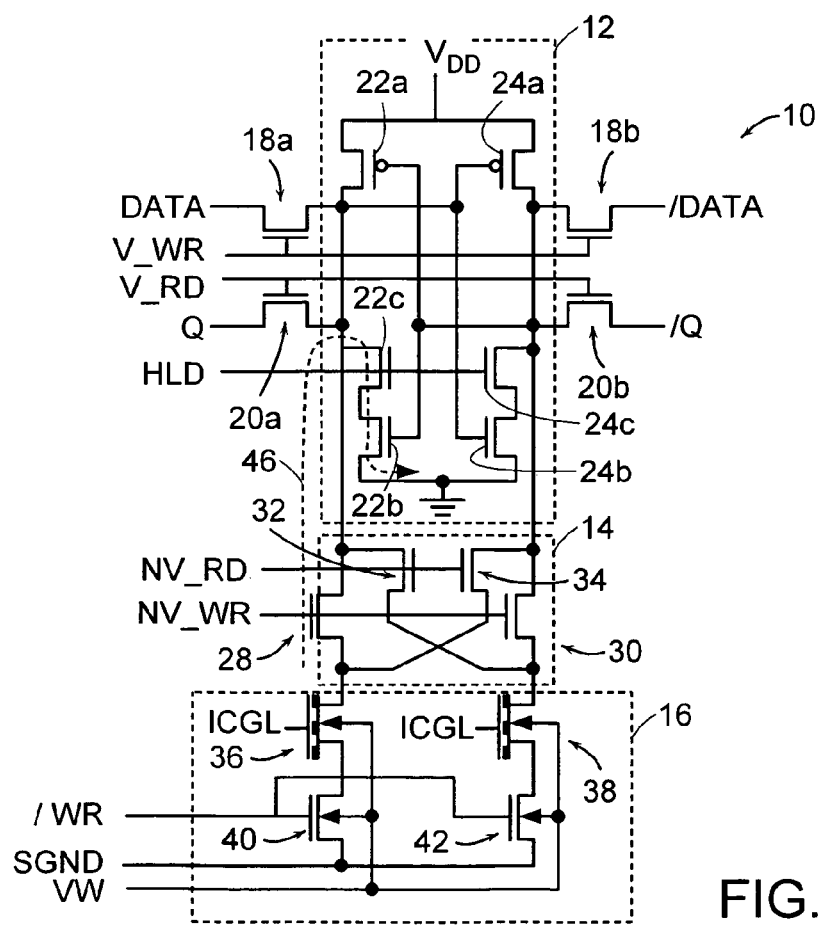
FIG. 2 is a circuit schematic of the latch, selection circuit and programmable storage element of FIG. 1, where a current path can occur through the latch if the programmable storage element is programmed during times when the latch writes data onto the storage element.

FIG. 2 illustrates in more detail latching circuit 10, and the various active and passive elements that form latch 12, selection circuit 14, and non-volatile storage device 16, according to one example. Instead of having a single pair of dual-purpose inputs and outputs, the data bus may have dedicated inputs separate and apart from dedicated outputs. As shown, the inputs receive DATA and /DATA and the outputs receive Q and /Q. Separate inputs and outputs may also allow separate write and read control lines. The write signals (V_WR) are used to couple the incoming data onto latch 12, and the read signals (V_RD) are used to couple the data from latch 12 back onto the data bus. As shown in FIG. 2, there could be two pairs of coupling transistors 18a/18b and 20a/20b.

In addition to separate incoming and outgoing lines, latch 12 can include a pair of cross-coupled inverters. A first inverter made up of transistors 22a and 22b has its output coupled to the input of the second inverter having transistors 24a and 24b. The reverse is also true: the output from transistors 24a and 24b is coupled to the input of transistors 22a and 22b. The inverters can involve both a p-channel transistor and an n-channel transistor as shown to form a pair of CMOS inverters, according to one example. Although not necessary, another pair of inverters 22c and 24c can be used to retain or "hold" the latched true and complementary logic values in latch 12 when the hold signal (HLD) is triggered to, for example, a logic high voltage value.

In order to write the latched logic value onto the non-volatile storage device 16, write transistors 28 and 30 are used. By placing, for example, a logic high voltage value onto transistors 28 and 30 via NV_WR signal, the latched voltage value within latch 12 is written onto storage device 16 provided certain conditions occur. Conversely, the written logic levels within device 16 can be read by placing, for example, a logic high voltage value on the NV_RD signal placed on the gate of read transistors 32 and 34. Selection circuit 14, therefore, is used to select the write into and read from non-volatile storage device 16.

Non-volatile storage device 16 can be made of any non-volatile storage mechanism including, but not limited to, PROMs or EEPROMs. If EEPROMs are used, then the non-volatile storage element can be erasable. The charge-transfer mechanism used by such erasable storage elements can be based on the injection of hot electrons into a floating polysilicon gate or possible the tunneling of charge through a thin gate oxide layer. The latter technique is often referred to as floating gate tunnel oxide or FLOTOX. FLOTOX typically utilizes charge-transfer by means of Fowler-Nordheim tunneling.

Programming the EEPROM transistors 36 and 38 may involve placing electronic charge on the floating gate through a relatively thin gate oxide layer. This can be achieved by placing a relatively large programming voltage onto the control gate (CGL) of transistors 36 and 38, while placing a relatively low voltage on the source and substrate of those transistors. The relatively low voltage can be, for example, a ground supply placed onto the source of transistors 36 and 38 by activating transistors 40 and 42 with a high voltage on the write (/WR) signal and placing a ground voltage on SGND and VW signals. Similar to the other transistors shown in FIG. 2, transistors 36 and 38 need only be FET-type devices, and are not specific to a particular FET, like a JFET, for example.

FLOTOX transistors can be expected to retain their programmed charges on the floating gate for many years if the memory device is subject to normal read cycles. Thus, once programmed, the charge remains on the floating gate until it is subsequently erased. Erasure of the charge on the floating gate can occur by placing a relatively low voltage on the control gate and relatively high voltage on the source and substrate via SGND and VW. The non-volatile storage device 16 can be bulk erased. This erasure is accomplished by grounding the gate of transistors 36 and 38 and raising the source, drain, and substrate to, for example, 9.5 volts in a deep n-well configuration.

Transistors 36 and 38 are programmed based on the voltage value written to them by transistors 28 and 30. After performing a bulk erase, for example, transistors 36 and 38 are programmed by enabling a programming voltage on one side and inhibiting programming on the other side, based on the data stored in the volatile latch. Programming is accomplished by grounding the source, drain, and substrate and applying, for example, 9.5 volts to the gate of transistors 36 and 38. Programming is inhibited by applying approximately 7.5 volts to the drain of transistors 36 and 38. The side of the latch which is at a low logic voltage value thus enables its corresponding transistor (either transistor 36 or 38) to be programmed, while the other side of the volatile latch inhibits its corresponding transistor from being programmed. According to one example, the inhibit voltage can be around 7.5 volts to manage high voltage PMOS technology and limitations.

The above voltages are merely examples of various levels that can be used to program and erase the non-volatile storage elements. In addition to the exemplary voltage values, it is recognized that the entire circuit 10 can be flipped, where many of the n-type transistors can be p-type, with power supply ($V_{DD}$) and ground supply connections also flipped. There are numerous different configurations that would achieve the dual-purpose circuit, all of which are hereby embodied.

One problem that can be inherent with the programming and read operations of device 16 is the deleterious current flow resulting in latch 12. For example, there may be instances in which non-volatile storage elements would require significant current when programmed. The programming current might be drawn from the storage elements through one of the two sides shown by dashed line 46. Current path 46 will draw current from a storage element to the ground supply voltage within latch 12 via the side in which the latch output is at a logic 0 voltage value, for example. This problem can be present in certain configurations of non-volatile storage elements and, for example, in storage elements that can be programmed only once.

Figure 3:
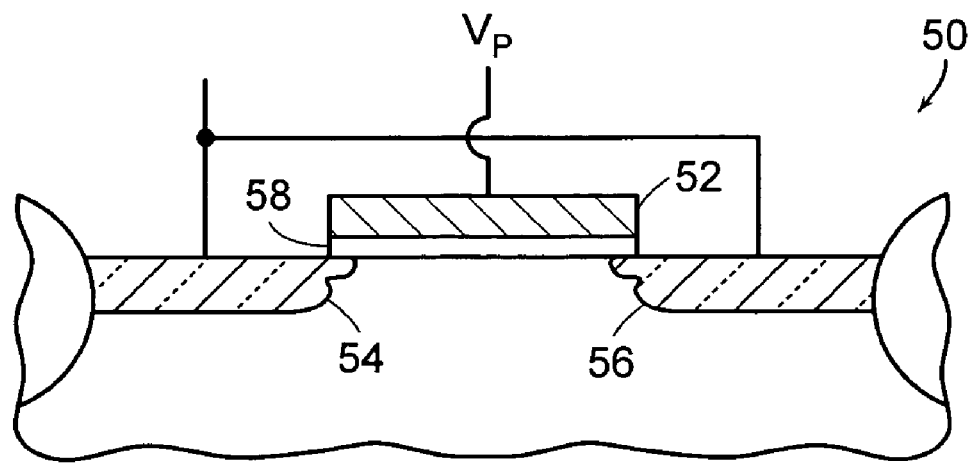
FIG. 3 is a partial cross-sectional view of the programmable storage element as a one-time anti-fuse, according to one embodiment.

FIG. 3 illustrates a one-time programmable storage element 50 that operates similar to an anti-fuse element. Storage element 50 is shown essentially as a transistor with a gate conductor 52 connected to a programming power supply, and the source and drain regions 54 and 56, respectively, mutually connected to receive voltages written into and read from storage element 50. Between gate conductor 52 and the underlying channel region of the substrate between the source and drain regions 54 and 56, is a gate oxide 58. The gate oxide 58 can be made of silicon dioxide or multiple layers of oxide and nitride. However formed, gate oxide 58 is preferably thin in at least a portion of its cross-section relative to gate oxides of other FETs within circuit 10 of FIG. 2. Although devices 36 and 38 can be FET-type devices, according to one example. Another implementation of the one-time programmable structure is a parallel-plate structure or a depletion region. For example, the storage element can be programmed by storing charge on the plates, on the oxide between plates, or on the oxide between a plate and a diffusion/implant region. Thus, instead of the one-time programmable element being a FET, the element can simply be a oxide separated by two conductive plates or separated by an diffusion region and a conductive layer/film.

When programming the one-time programmable storage element 50, a logic 0 voltage value is placed on the mutually-connected source and drain regions 54 and 56, while a programming voltage is placed on $V_P$ of gate conductor 52. This causes the gate oxide to break down at the thin gate oxide regions and current to be drawn across the gate oxide to create a n-type silicon filament. This will form a diode that acts similar to a saturated drain. Thus, when programmed with a substantial voltage difference between the gate and mutually-connected source/drain, the one-time programmable anti-fuse element will blow closed, and will thereafter appear essentially as a low resistive pull-up to whatever ensuing voltage is place on gate conductor 52. After storage element 50 is programmed, $V_P$ can be reduced from a relatively high voltage to a logic 1 voltage value (e.g., from 9.5 volts to approximately 1.8 volts). Thereafter, whenever the programmed storage element is to be read onto the latch, what will be read is the logic 1 voltage value or approximately 1.8 volts.

Referring to FIGS. 2 and 3, a disadvantage of using one-time programming storage element 50 is that whenever, for example, 9.5 volts is placed at $V_P$ during programming, current will flow across gate oxide 58 and onto the mutually-connected source and drain regions 54 and 56, and eventually along path 46 to the ground conductor of latch 12. At a 9.5 volts programming voltage, a rather large current in excess of 1 mA will be drawn through path 46 to ground. To prevent deleterious high amounts of current through the activated FETs of the logic 0 side, the FETs must be made significantly large (made with a large gate length and width) and/or a blocking transistor must be used. In either instance, the overall size of circuit 10 must be significantly increased to accommodate the large programming currents. An alternative solution is thereby needed.

Figure 4:
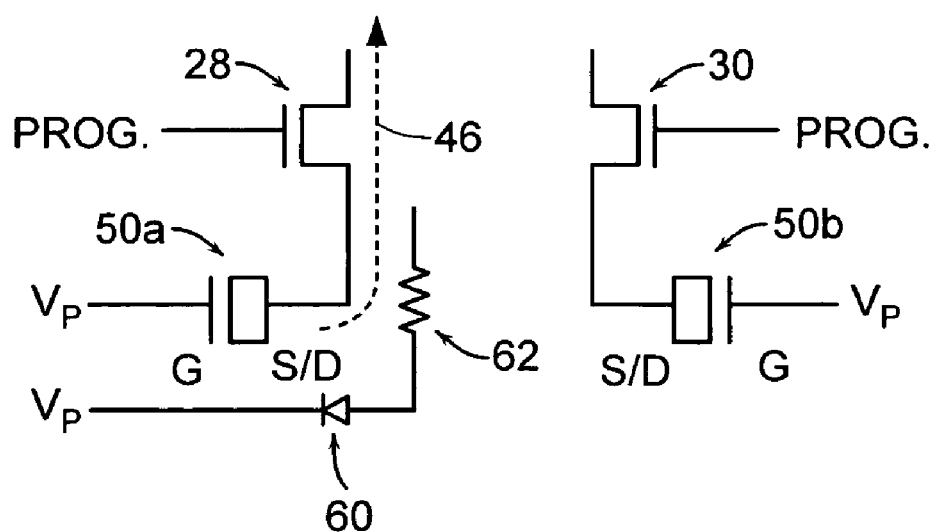
FIG. 4 is a circuit schematic of the programmable storage element being programmed, and the programming high current path from the storage element.

FIG. 4 illustrates two one-time programmable storage elements 50a and 50b for the corresponding true and complementary sides of a latching circuit. When programmed, a programming signal (PROG.) will activate the respective write transistors 28 and 30. However, if the left side of the latch is at a logic 0 voltage value, then storage element 50a will blow closed, causing the storage element to appear as a diode 60 in series with a low resistive resistor 62. Programming current will then flow through the left side and, if not maintained solely in the storage element, the current will traverse the latch and either harm the latch or require the FETs to be too large for the latching circuit to be of practical application in a high density storage environment.

Figure 5:
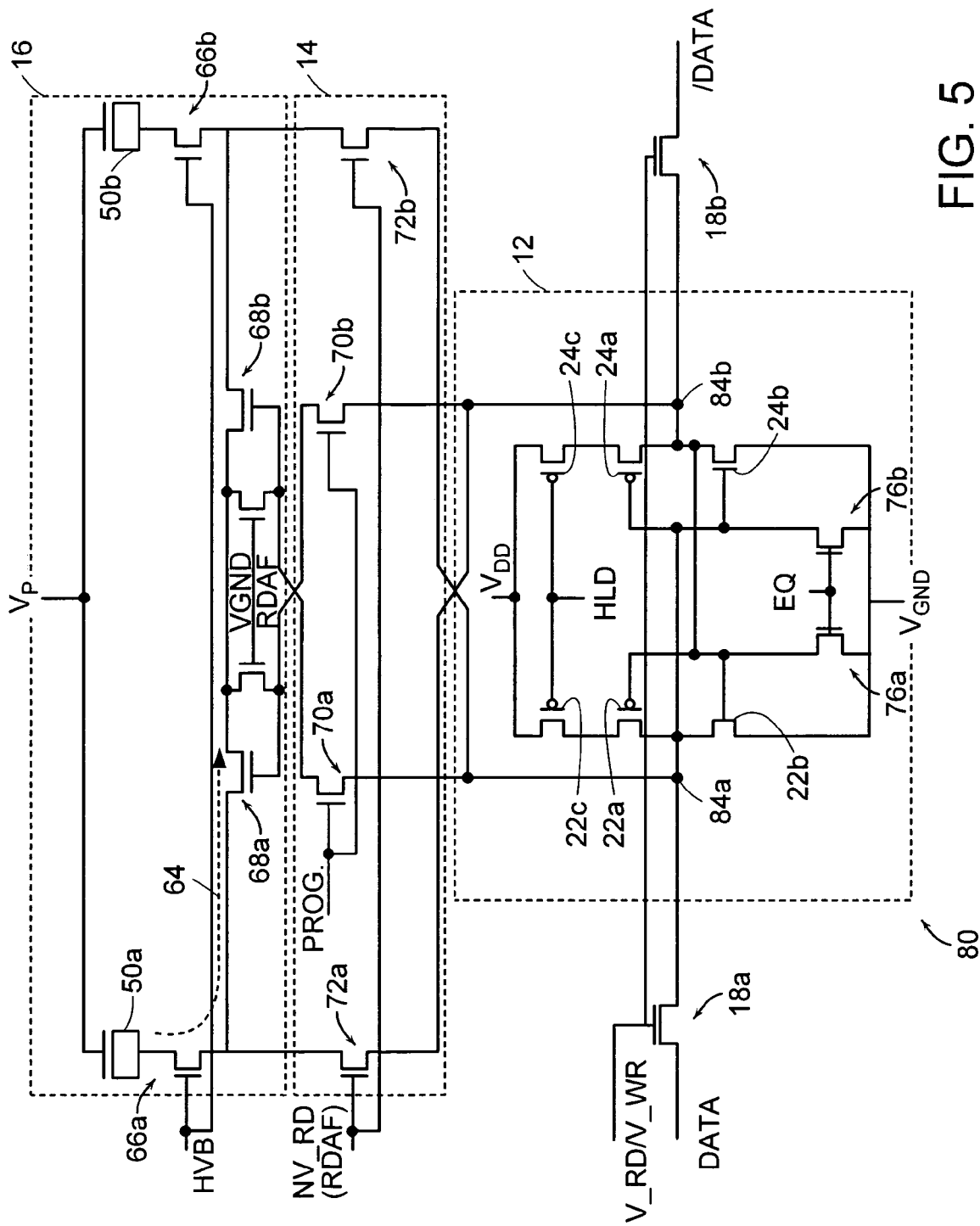
FIG. 5 is a circuit schematic of a latch, selection circuit and programmable storage element that avoids routing the high current path through the latch when the storage element is being programmed, or written to by the latch.

FIG. 5 illustrates a solution in which the programming current is maintained along path 64 to a ground supply in the non-volatile storage region 16, rather than traversing the selection circuit 14 or latch 12. Keeping the current of the storage element entirely within the storage element circuitry avoids having to enlarge the FETs within selection circuit 14 and/or latch 12. This will significantly reduce the power consumption within those circuits, but also reduce the overall size of those circuits. The only FET that must be somewhat large are high voltage blocking transistors 66a and 66b placed next to storage elements 50a and 50b.

Storage elements 50a and 50b can each appear similar to storage element 50, shown in FIG. 3. By applying the appropriate voltage on transistors 66a and 66b and selecting transistors 68a and 68b via output from programming transistors 70a and 70b, one of the pair of storage elements 50 will be blown closed while the other will remain open. Reading the programmed voltage from the appropriate storage element 50 takes place by activating transistors 66 and transistors 72a and 72b. This will cause whatever is permanently stored in circuit 16 to be placed on the appropriate left or right side of latch 12. The various transistors in latch 12 of FIG. 5 are similarly labeled from the labels given those transistors in FIG. 2. In addition to the cross-coupled inverters and the hold transistors, equalization transistors 76a and 76b can be used. The functionality of all of the various transistors that represent the latching circuit 80 of FIG. 5 is best illustrated in reference to FIGS. 6–8.

Turning to the combination of FIGS. 5, 6 and 8, FIG. 6 illustrates what would occur when data is written to latch 12 from, for example, a data bus of FIG. 5. Prior to data being written, FIG. 8 indicates in its first row, the idle or hold state in which transistors 18 are inactive or off, and the hold signal is at a logic 0 voltage value to enable the cross-coupled inverters. Whatever was the previous true and complementary data values within latch 12 will thereby be maintained or held during this state.

As shown in FIG. 6, at time $T_1$, the data on the data bus can transition and, for example, the hold signal can go to a logic high voltage value, along with the equalization signal (EQ). This will cause the latch to disable momentarily while the hold signal is high and the equalization transistors to both turn on to equalize the sense amplifiers within latch 12. Thereafter, at time $T_2$ transistors 18 are enabled to allow the data to be written into latch 12. The data, however, will not be latched until the cross-coupled inverters are enabled by the hold signal transitioning to a logic 0 voltage value at time $T_3$. In the interim, the output on both the true and complementary sides will be drawn to a logic 0 voltage value as shown by dashed line 82, provided the latch employs equalization transistors that are activated by equalization signal (EQ). At time $T_3$, the data written to the latch from the data bus will be present on the output of the latch, shown as reference 84a and 84b of FIG. 5.

FIG. 6 indicates the timing operation for writing data from a data bus onto latch 12 of FIG. 5. Circuits 14 and 16 are disabled during the time in which data is written to latch 12 by maintaining the high voltage blocking signal (HVB), the read anti-fuse signal (RDAF), and the program signal (PROG.) at a logic 0 voltage value. Thus, the latch voltage appearing at node 84 will remain there and will not be written to (or programmed upon) a yet-to-be programmed storage element 50a or 50b.

FIG. 8 indicates in the second column the various voltage values for the signals used in FIG. 5. It is recognized that "EN" is the signal placed at the input of transistors 18a and 18b of FIG. 5. To reduce contention between the latch and the data bus, the hold signal is shown to be pulled high and then dropped to a logic low voltage value at time $T_3$ (FIG. 6). The enable signal is returned low at time $T_4$ to disconnect the latch from the data bus. Data can also be written from the output Q and /Q port, but this port is normally only used to reading data. Data can also be read from the latch to the data bus. The data bus is placed in a high-impedance state and the enable signal is enabled to a logic 1 voltage value. This connects the volatile data to the complementary and true data bus. The same operation can be performed on the read Q and /Q port.

The third row of FIG. 8 illustrates programming of the storage element from data stored in the latch. The storage element 50 is programmed by enabling programming on one side and inhibiting programming on the other side based on the data stored in the volatile latch. Programming is achieved by placing a logic 0 voltage value on the side to be programmed and, more specifically, placing the logic 0 voltage value on the mutually-connected source and drain. Meanwhile, a programming voltage is applied to the gate of the storage element transistor. This will cause programming current to flow along path 64 shown in FIG. 5. As such, the side of the latch which is at a logic 0 voltage value enables its corresponding storage element to be programmed, while the other side of the latch inhibits is corresponding storage element from being programmed.

Since data is not being read from the data bus, the enable signal is at a logic 0 voltage value. The hold signal is also a logic 0 voltage value to enable the latch output. Since the storage element is not being read, but is being written to, the RDAF signal is at a logic 0 voltage signal. To forward the appropriate logic 0 voltage from the latch from one of the two sides of the latch to the storage element, the programming signal (PROG) must be a logic 1 voltage value, as well as the high voltage blocking signal (HVB). The programming voltage ($V_P$) is maintained at a logic value even greater than the power supply voltage. If the power supply voltage is set at approximately 1.8 volts, then the programming voltage can be several times that (e.g., approximately 9.5 volts).

Once programmed, the storage elements 50 can be read from the storage elements as shown by the combination of FIG. 7 and the fourth row of FIG. 8. Since no data is being written to or read from the data bus, the enable signal is maintained at a logic low voltage value. The read anti-fuse transistor 72 and the high voltage blocking transistor 66 are activated to allow the programmed voltage on the appropriate storage element 50a or 50b to be conveyed onto the appropriate node 84a or 84b. Since the storage element was previously programmed, the voltage that is being conveyed need not be a programming voltage, but can simply be a power supply voltage such as, for example, 1.8 volts. The hold signal is maintained at a logic low voltage value to enable the latch so that the cross-coupled inverters operate essentially as a sense amplifier.

FIG. 7 illustrates in further detail the timing sequence in which data in the storage element is written to the latch. Prior to writing the latch, the latch can be disabled by driving the hold signal high at time $T_5$, and the sense amplifiers can be equalized by driving the equalization signal high at time $T_6$. The output of the latch will correspondingly drop pursuant to the equalization signal being activated and, when equalization no longer applies, the output of the latch will essentially be placed in a common-mode state at time $T_7$. The common-mode state allows the sense amplifiers to freely swing to opposing rails once the high voltage blocking signal and the read anti-fuse signal are activated. This will cause whatever is stored in the corresponding storage element to drive the latch output to the corresponding rails at time $T_8$. The programmed data will be retained on the latch output even after the HVB and RDAF signals terminate since the volatile latch will assume its latching function. As shown in the fourth row of FIG. 8, the programming signal is maintained at a logic low voltage value to ensure a read operation from the anti-fuse and not a write operation to the anti-fuse.

Figure 9:
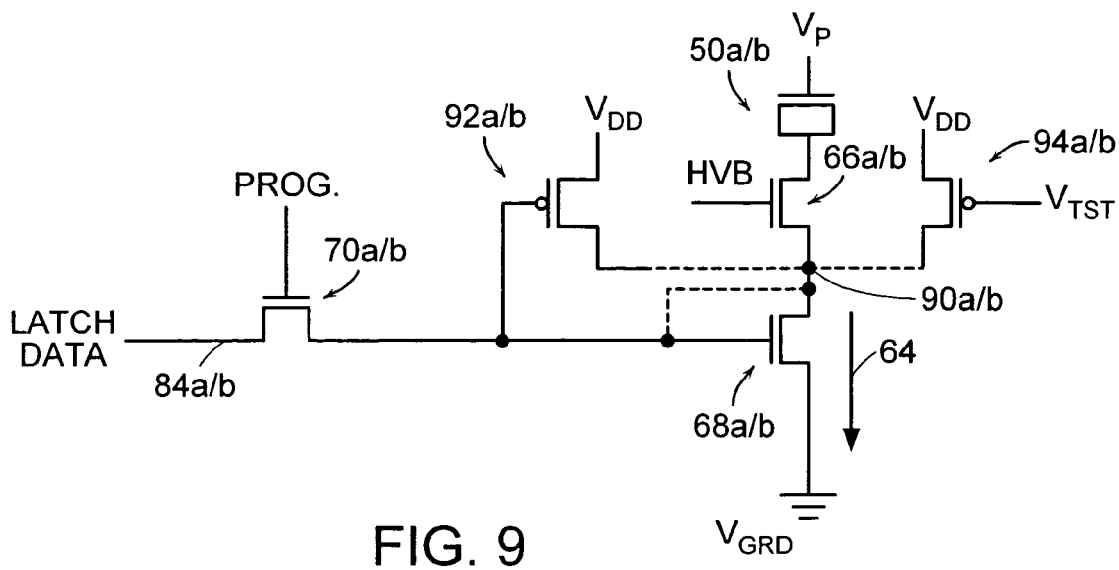
FIG. 9 is a circuit schematic of a portion of the selection circuit placed outside the current path through the programmable storage element when the storage element is programmed, and wherein a pull-up/pull-down transistor can be used to prevent floating nodes and current leakage in the current path when inactive.
Figure 10:
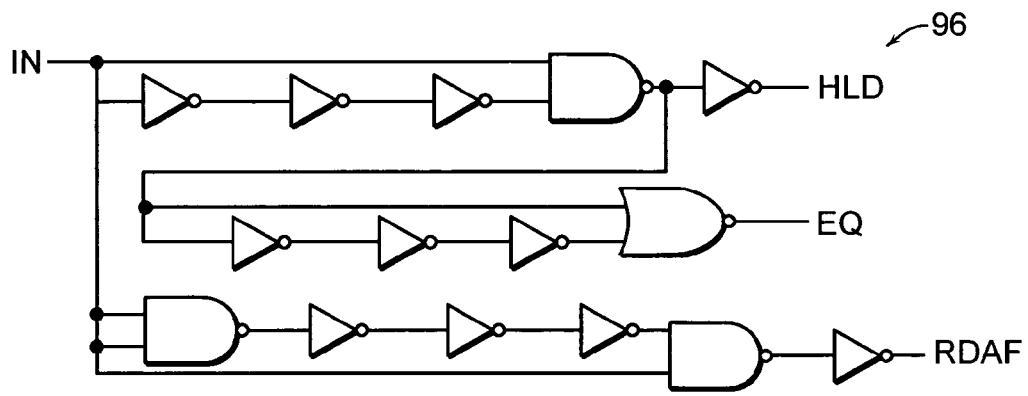
FIG. 10 is a circuit schematic of a circuit used to form the timing sequence for reading onto the latch data stored in the storage device.
Figure 11:
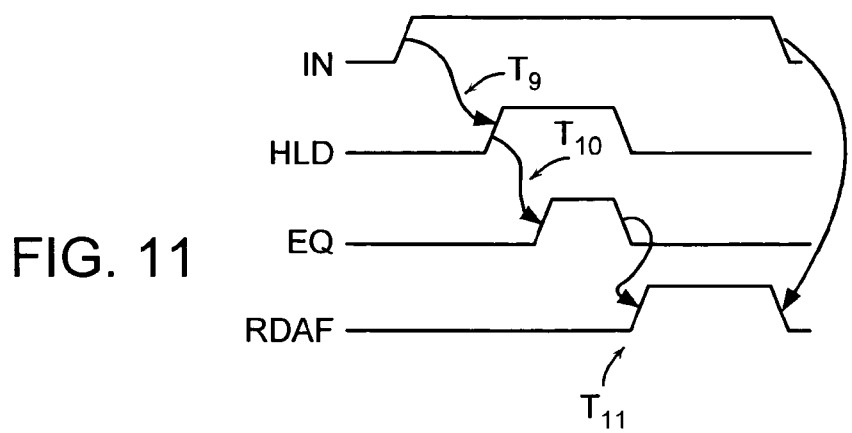
FIG. 11 is a timing diagram of the circuit of FIG. 10 during operation.

FIGS. 9 through 11 represent certain enhancements to the configuration and functionality of the latching circuit 80 in FIG. 5. Specifically, FIG. 9 illustrates a portion of circuit 80. The programming current path 64 will result when transistors 66 and 68 are activated via the high voltage blocking signal and an appropriate logic value on the program signal. The latched data will then be placed on the gate of the selecting transistor 68 to cause the programming current to flow along path 64, but not into node 84. Latch 12 thereby does not receive any programming current. Transistor 66 is preferably a high voltage blocking transistor that is of larger size than the other FETs shown.

To avoid a floating node 90a or 90b on opposing sides of the non-volatile storage device, a pull-up transistor 92a or 92b can be added. Therefore, during times when the storage element is not being programmed, the input to transistor 92 will be at a logic 0 voltage value thereby pulling up node 90, and preventing the node from floating between a power supply and ground. This will prevent transient conditions in, for example, the high voltage blocking transistor 66 (a and b) and thereby prevent current leakage along path 64.

In addition to the pull-up transistor option, transistor 68 can be eliminated also as an option. If transistor 68 is eliminated, the new selecting transistor becomes transistor 66, which serves a dual role as a selecting transistor and a high voltage blocking transistor. Thus, an option exists in which to connect the output of programming transistor 70 directly to transistor 66.

As yet another option, a margin-testing transistor 94 (a or b) can be added and connected as shown by the dashed line. Margin-testing transistor 94 is connected to add current from the power supply ($V_{DD}$) to node 90 to determine a sense margin for sensing voltage differential on that node by the latch when the latch is being written to from the storage element. Alternatively, transistor 94 can be connected to a ground supply to subtract current from the node. Regardless, current can be added or subtracted to determine a sense margin and test the sense margin across different process, voltage, and temperature parameters.

FIG. 10 illustrates a circuit 96 used to generate logic signals for writing the latch from the storage elements. As shown by the combination of FIGS. 10 and 11, when referencing FIG. 7, a single input signal can be used to derive the hold, equalization, and read anti-fuse signals established at specific times in order to write data to the latch from the storage element or anti-fuse. Circuit 96 indicates, in combination with the timing diagram of FIG. 11, the generation of the hold signal first at time $T_9$. Thereafter, the equalization signal is formed at time $T_{10}$, and then the read anti-fuse signal is formed at time $T_{11}$. A single circuit can, therefore, be developed to generate the control signals used to write data into the latch from the storage elements.

It will be appreciated to those skilled in the art having the benefit of this disclosure, that the various embodiments herein are ones generally describing the volatile and non-volatile storage of data. Data can arrive from a data bus and be sent back to the data bus, and the data can be represented as digital data with a logic high and logic low voltage values. Moreover, the data has both a true and complementary voltage value for each data point reference so that the latch operates essentially as a sense amplifier to detect differences in those true and complementary values. The non-volatile storage element includes any storage element that can retain a programmed value with or without an erase capability. Thus, regardless of whether the storage element is a one-time programmable storage element or can be erased, the present circuit is applicable provided the storage element produces substantial current during a certain mode of operation, and that current is not routed within the latch or selection circuit.

What is claimed is:

1. A circuit, comprising:
   a latch;
   a storage element coupled to the latch and, during programming of the storage element, the storage element avoids forwarding current from the storage element into the latch; and
   a blocking transistor having a source-to-drain path coupled between the storage element and through a programming transistor to an output of the latch.

2. The circuit as recited in claim 1 wherein the circuit is formed using a fabrication process capable of forming sub one-quarter micron features.

3. The circuit as recited in claim 1 wherein the circuit is formed using a fabrication process that avoids additional steps or features needed to accommodate programming voltages that exceed twice the voltages on the latch.

4. The circuit as recited in claim 1, wherein the latch comprises a pair of cross-coupled inverters.

5. The circuit as recited in claim 4, further comprising a pair of pass-gate transistors coupled to a data bus to forward true and complementary bit values onto respective ones of the pair of cross-coupled inverters.

6. The circuit as recited in claim 1, further comprising a selecting transistor having a gate conductor and a source-to-drain path, and wherein the gate conductor is coupled through the programming transistor to the output of the latch, and the source-to-drain path is coupled between a ground supply and through the blocking transistor to the storage element.

7. The circuit as recited in claim 1, wherein the storage element comprises a one-time programmable storage element.

8. The circuit as recited in claim 7, wherein the one-time programmable storage element comprises a dielectric that (i) upon receiving a programming voltage differential across the dielectric a relatively low resistive path will occur to a power supply, and (ii) upon receiving a non-programming voltage differential across the dielectric a relatively high resistive path will occur to the power supply.

9. A one-time programmable latching circuit, comprising:
   a latch having two pairs of latching transistors connected to form a pair of cross-coupled inverters;
   a pair of one-time programmable storage elements coupled to respective outputs of the inverters, wherein the storage elements include a pair of storing transistors having a gate oxide thickness dissimilar from a gate oxide thickness of any of the set of latching transistors; and
   a selection circuit that includes a pair of programming transistors with source-to-drain paths coupled between inputs of the pair of cross-coupled inverters and gates of a pair of selecting transistors; and
   a margin-testing transistor coupled to vary current from the pair of storage elements read as a voltage differential at an output of the pair of cross-coupled inverters.

10. The latching circuit as recited in claim 9, wherein the latching circuit is formed using a fabrication process capable of forming sub one-quarter micron features.

11. The latching circuit as recited in claim 9, wherein the latching is circuit is formed using a fabrication process that avoids additional steps or features needed to accommodate programming voltages that exceed twice the voltages on the latch.

12. The latching circuit as recited in claim 9, further comprising a data bus coupled to inputs of the pair of cross-coupled inverters.

13. The latching circuit as recited in claim 9, wherein the programming transistors include a gate terminal adapted to receive a programming voltage and, upon receiving the programming voltage, one of the programming transistors causes programming current to flow from one of the pair of storage elements, through one of the pair of selecting transistors, and directly to a ground supply conductor configured within the latching circuit outside the latch.

14. The latching circuit as recited in claim 9, wherein the programming transistors include a gate terminal adapted to receive a programming voltage and, upon receiving the programming voltage, one of the programming transistors causes a binary value on the data bus to be placed on a gate of one of the pair of selecting transistors causing current to flow from one of the pair of storage elements, through one of the pair of selecting transistors, and directly to a ground supply conductor configured within the latching circuit outside the latch.

15. The latching circuit as recited in claim 9, wherein the latch further comprises a holding transistor coupled between each of the two pair of latching transistors to maintain a latched voltage value on the output of the pair of cross-coupled inverters during times when the holding transistor is activated.

16. The latching circuit as recited in claim 9, wherein the one-time programmable storage element comprises a dielectric that (i) upon receiving a programming voltage differential across the dielectric a relatively low resistive path will occur to a power supply, and (ii) upon receiving a non-programming voltage differential across the dielectric a relatively high resistive path will occur to the power supply.

* * * * *